United States Patent
Zhu et al.

(10) Patent No.: US 7,485,510 B2
(45) Date of Patent: Feb. 3, 2009

(54) FIELD EFFECT DEVICE INCLUDING INVERTED V SHAPED CHANNEL REGION AND METHOD FOR FABRICATION THEREOF

(75) Inventors: Huilong Zhu, Poughkeepsie, NY (US); Ravikumar Ramachandran, Pleasantville, NY (US); Effendi Leobandung, Wappingers Falls, NY (US); Mahender Kumar, Fishkill, NY (US); Wenjuan Zhu, Fishkill, NY (US); Christine Norris, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/538,174

(22) Filed: Oct. 3, 2006

(65) Prior Publication Data
US 2008/0079037 A1    Apr. 3, 2008

(51) Int. Cl.
*H01L 21/84* (2006.01)
(52) U.S. Cl. ............ 438/157; 438/164; 438/283; 257/E21.429
(58) Field of Classification Search ............ 438/151, 438/157, 164, 283, 284; 257/E21.415, E21.416
See application file for complete search history.

(56) References Cited

U.S. PATENT DOCUMENTS

| | | | |
|---|---|---|---|
| 5,250,454 A | 10/1993 | Maszara | |
| 5,736,435 A * | 4/1998 | Venkatesan et al. | 438/151 |
| 6,117,712 A | 9/2000 | Wu | |
| 6,380,027 B2 * | 4/2002 | Furukawa et al. | 438/241 |
| 6,504,173 B2 * | 1/2003 | Hsu et al. | 257/60 |
| 6,914,303 B2 | 7/2005 | Doris et al. | |
| 6,924,517 B2 | 8/2005 | Chen et al. | |
| 6,939,751 B2 | 9/2005 | Zhu et al. | |
| 7,019,342 B2 * | 3/2006 | Hackler et al. | 257/250 |
| 7,407,844 B2 * | 8/2008 | Loo et al. | 438/151 |
| 2005/0090066 A1 | 4/2005 | Zhu et al. | |
| 2006/0001095 A1 | 1/2006 | Doris et al. | |
| 2006/0027881 A1 * | 2/2006 | Ilicali et al. | 257/401 |

* cited by examiner

*Primary Examiner*—Tuan N. Quach
(74) *Attorney, Agent, or Firm*—Scully, Scott, Murphy & Presser, P.C.; Todd M. C. Li, Esq.

(57) ABSTRACT

A semiconductor structure includes a semiconductor layer that includes an inverted V shaped channel region that allows avoidance of a raised source/drain region within the semiconductor structure. In one embodiment, a generally conventional gate electrode is located over a planar surface of the semiconductor layer over the inverted V shaped channel region. In another embodiment, the foregoing generally conventional gate electrode is used in conjunction with an inverted V shaped gate electrode that is located within an inverted V shaped notch that comprises the inverted V shaped channel region.

1 Claim, 16 Drawing Sheets

FIELD EFFECT DEVICE INCLUDING INVERTED V SHAPED CHANNEL REGION AND METHOD FOR FABRICATION THEREOF

BACKGROUND

1. Field of the Invention

The invention relates generally to field effect devices. More particularly, the invention is related to field effect devices with enhanced performance.

2. Description of the Related Art

Field effect devices, such as field effect transistors, are commonly used in semiconductor circuits. Field effect transistors find such common use due to a low power consumption, a relative ease of fabrication of field effect transistors, and a relative ease in scaling of field effect transistors.

While field effect transistors are readily fabricated and readily scaled to increasingly smaller dimensions, field effect transistors when scaled to increasingly smaller dimensions are nonetheless not entirely without problems. In particular, field effect transistors when scaled to increasingly smaller dimensions are often susceptible to short channel effects (SCEs). Short channel effects are electrical effects that are manifested when a gate electrode partially or completely loses electrical control over a channel region within a semiconductor substrate. Such loss of control of a gate electrode over a channel region increases as a channel length is scaled down.

One method that may be used to control an SCE is to use an ultra thin semiconductor-on-insulator (UT-SOI) structure in the channel area of a MOSFET. However, the mobilities of charge carriers in UT-SOI are degraded. In turn, the charge carrier mobility degradation causes an undesirable degradation of device performance. Therefore, desirable are MOSFET structures that may possess UT-SOI channel dimensions (to obtain good control of SCE) while simultaneously maintaining acceptable carrier mobility and desirable performance.

Various semiconductor structures having desirable properties, and methods for fabrication thereof, are known in the semiconductor fabrication art.

For example, Doris et al., in U.S. Pub. No. 2006/0001095, teaches a method for fabricating a field effect transistor within an ultra-thin semiconductor-on-insulator substrate in a fashion that minimizes a threshold voltage variation of the field effect transistor. To achieve the foregoing result, this particular method includes varying a semiconductor-on-insulator thickness in conjunction with a variation of gate length within the field effect transistor.

In addition, Zhu et al., in U.S. Pub. No. 2005/0090066 and U.S. Pat. No. 6,939,751, teaches a field effect transistor structure comprising a raised source/drain region fabricated with enhanced epitaxial control. To achieve the foregoing result, this particular field effect transistor structure uses a silicon-germanium alloy layer over a silicon layer when fabricating the raised source/drain region.

Further, Chen et al., in U.S. Pat. No. 6,924,517, teaches a field effect transistor structure fabricated within an ultra-thin semiconductor-on-insulator substrate to provide the field effect transistor with enhanced performance. This particular field effect transistor structure realizes the foregoing object by using a comparatively thin channel region that separates source/drain regions that are recessed to a depth greater than the comparatively thin channel region.

Still further, Doris et al., in U.S. Pat. No. 6,914,303, teaches a method for fabricating an ultra-thin channel metal oxide semiconductor field effect transistor with a decreased channel resistance and a decreased thermal budget. This particular method realizes the foregoing objects by using multiply offset spacer layers when fabricating the metal oxide semiconductor field effect transistor.

Yet further, Wu, in U.S. Pat. No. 6,117,712, teaches a method for fabricating a field effect transistor on a semiconductor-on-insulator substrate to provide the field effect transistor with an ultra-short channel. The particularly disclosed method includes use of a high permittivity dielectric material layer.

Finally, Maszara, in U.S. Pat. No. 5,250,454 teaches a method for forming a raised source/drain region within a field effect transistor device. This particular method uses epitaxial recrystallization of an amorphous semiconductor material layer formed upon a monocrystalline non-raised source/drain region.

Semiconductor structure and device dimensions are certain to continue to decrease, and as a result thereof desirable are semiconductor structures with enhanced performance at decreased dimensions. Particularly desirable are field effect devices, such as field effect transistors, fabricated with decreased dimensions and also having reduced short channel effects, without degradation of carrier motilities. Also desirable are related methods for fabricating the semiconductor structures with the foregoing enhanced performance characteristics at decreased dimensions.

SUMMARY OF THE INVENTION

The invention provides semiconductor structures including semiconductor devices having enhanced SCE control at decreased semiconductor structure dimensions. The invention also provides methods for fabricating the semiconductor structures. In particular, the semiconductor structures include semiconductor devices having an inverted V shaped channel region that imparts enhanced performance to a field effect device, such as a field effect transistor, fabricated within the semiconductor structures.

A semiconductor structure in accordance with the invention includes a semiconductor device including an inverted V shaped channel region separated from a gate electrode by a gate dielectric.

Another semiconductor structure in accordance with the invention includes a semiconductor layer located over a substrate and having a first planar surface and an inverted V shaped notch within a second interface opposite the first planar surface. This semiconductor structure also includes a first gate dielectric located upon the first planar surface and a first gate electrode located upon the first gate dielectric and aligned with the inverted V shaped notch. This semiconductor structure also includes a second gate dielectric located upon the inverted V shaped notch and a second inverted V shaped gate electrode located upon the second gate dielectric and filling the inverted V shaped notch.

A method for fabricating a semiconductor structure in accordance with the invention includes forming within a semiconductor layer a V shaped notch. The method also includes inverting the semiconductor layer to provide a first planar surface and a second interface opposite the first planar surface and including an inverted V shaped notch. The method also includes forming a first gate electrode over the first planar surface and aligned with the inverted V shaped notch.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which includes semiconductor structures having enhanced performance and methods for fabricating the semiconductor structures, is understood within the context of the description provided below. The description provided below is understood within the context of the drawings described above. Since the drawings are intended for illustrative purposes, the drawings are not necessarily drawn to scale.

FIG. 1 to FIG. 12B show a series of schematic cross-sectional and plan-view diagrams illustrating the results of progressive stages in fabricating a semiconductor structure in accordance with an embodiment of the invention. This embodiment comprises a first embodiment of the invention.

Figure 1:
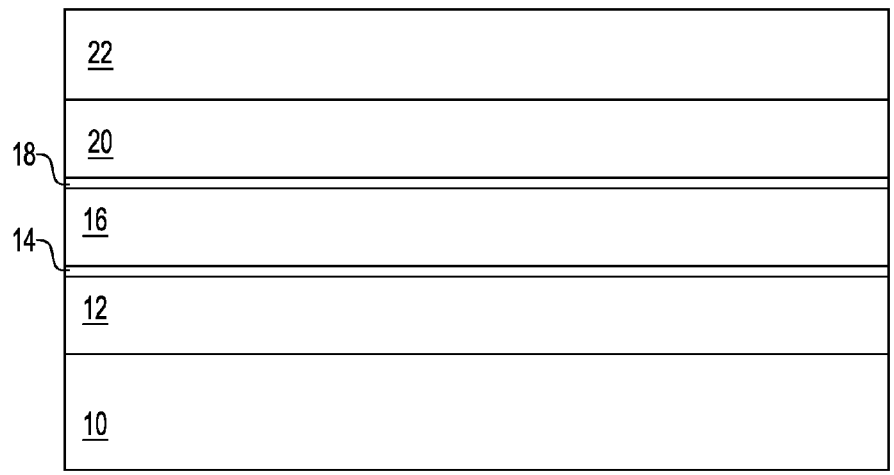
FIGS. 1, 2, 2A, 2B, 3, 3A, 3B, 4A, 4B, 5A, 5B, 6, 6A, 6B, 7, 7A, 7B, 8A, 8B, 9, 9A, 9B, 10, 10A, 10B, 11, 11A, 11B, 12, 12A, and 12B show a series of schematic cross-sectional and plan-view diagrams illustrating the results of progressive stages in fabricating a semiconductor structure in accordance with an embodiment of the invention.

FIG. 1 illustrates, in layered sequence: (1) a base semiconductor substrate 10; (2) a first buried dielectric layer 12 located upon the base semiconductor substrate 10; (3) an etch stop layer 14 located upon the first buried dielectric layer 12; (4) a second buried dielectric layer 16 located upon the etch stop layer 14; (5) a third buried dielectric layer 18 located upon the second buried dielectric layer 16; (6) a surface semiconductor layer 20 located upon the third buried dielectric layer 18; and (7) a hard mask layer 22 located upon the surface semiconductor layer 20.

Each of the foregoing semiconductor substrate 10 and layers 12/14/16/18/20/22 that are located thereupon or thereover may comprise materials, have dimensions and be formed using methods that are otherwise generally conventional in the semiconductor fabrication art.

The base semiconductor substrate 10 and the surface semiconductor layer 20 may comprise any of several semiconductor materials. Non-limiting examples include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The base semiconductor substrate 10 and the surface semiconductor layer 20 may comprise either the same semiconductor material or a different semiconductor material with respect to chemical composition, crystallographic orientation, dopant polarity and dopant concentration. Typically, the base semiconductor substrate 10 and the surface semiconductor layer 20 comprise a silicon semiconductor material. Typically, the base semiconductor substrate 10 has a thickness from about 0.5 to about 1.5 mm. Typically the surface semiconductor layer 20 has a thickness from about 700 to about 1000 angstroms.

The first buried dielectric layer 12, the second buried dielectric layer 16, the third buried dielectric layer 18 and the dielectric capping layer 22 may similarly also comprise dielectric materials selected from a single group of dielectric materials. Different dielectrics are also contemplated for layers 12, 16, 18 and 22. The dielectric materials may include, but are not limited to crystalline dielectric materials and non-crystalline dielectric materials. The dielectric materials may include, but are not limited to oxides, nitrides and oxynitrides of silicon. Oxides, nitrides and oxynitrides of other elements are not excluded. The first buried dielectric layer 12, the second buried dielectric layer 16, the third buried dielectric layer 18 and the dielectric capping layer 22 may be formed using any of several methods that are appropriate to their materials of composition. Non-limiting examples of methods include thermal or plasma oxidation or nitridation methods, chemical vapor deposition methods (including atomic layer chemical vapor deposition methods) and physical vapor deposition methods (including sputtering methods).

Although the following selections do not limit the instant embodiment or the invention, typically, the first buried dielectric layer 12 comprises a silicon oxide material that has a thickness from about 400 to about 600 angstroms. Typically, the second buried dielectric layer 16 comprises a silicon nitride material that has a thickness from about 500 to about 700 angstroms. Typically, the third buried dielectric layer 18 comprises a silicon oxide material that has a thickness from about 40 to about 60 angstroms. Typically, the dielectric capping layer 22 comprises a silicon oxide material that has a thickness from about 1300 to about 1700 angstroms.

The etch stop layer 14 may comprise any of several etch stop materials. Non-limiting examples include conductor etch stop materials, semiconductor etch stop materials and dielectric etch stop materials. For reasons that will become more apparent within the context of additional description below, the etch stop layer 14 comprises an etch stop material that is susceptible to localized modification that provides a region specific etch selectivity for the etch stop layer 14. Thus, although also clearly not limiting the invention, the etch stop layer 14 typically comprises a polysilicon etch stop material that is susceptible to region selective ion implantation induced solubility enhancement when ion implanted with an appropriate ion implant material.

Figure 2:
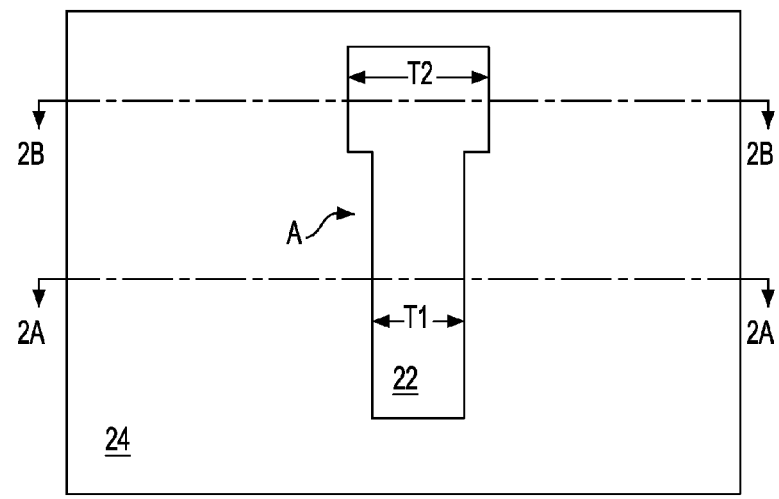
Figure 2A:
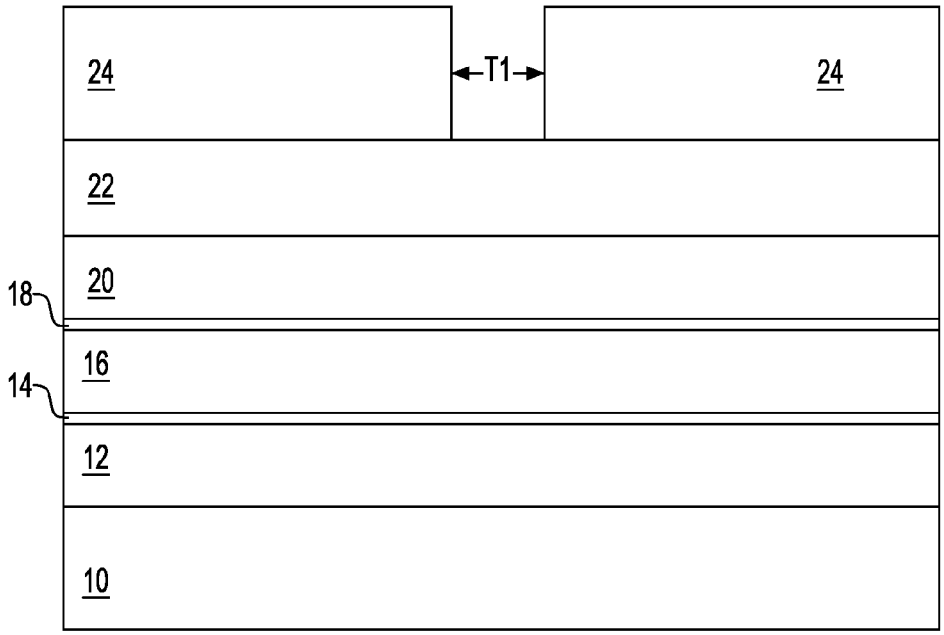
Figure 2B:
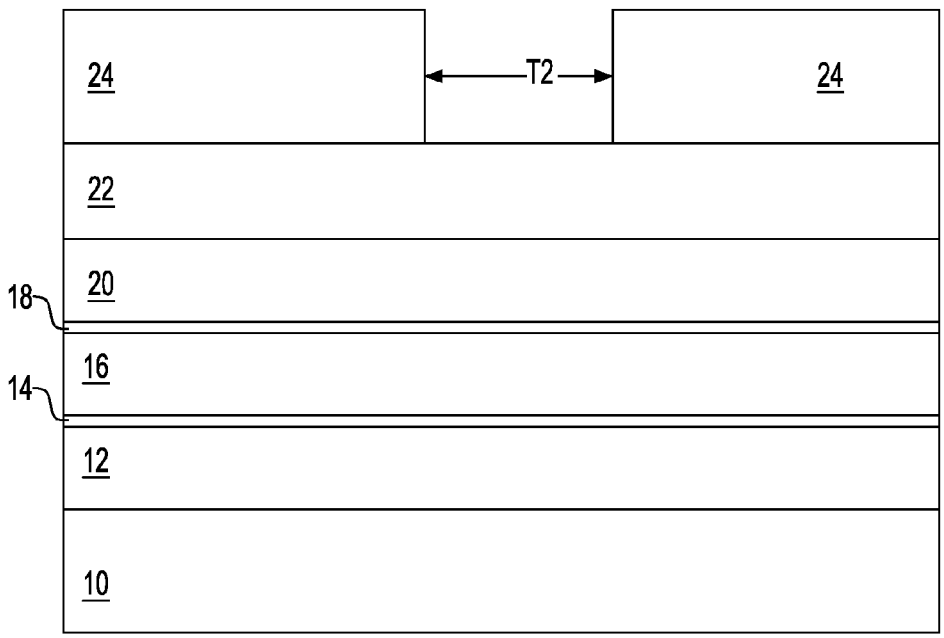

FIG. 2, FIG. 2A and FIG. 2B shows a schematic plan-view and schematic cross-sectional diagrams illustrating the results of further processing of the semiconductor structure of FIG. 1.

FIG. 2, FIG. 2A and FIG. 2B show a photoresist layer 24 located upon the dielectric capping layer 22 within the semiconductor structure of FIG. 1. A T shaped aperture A is located within the photoresist layer 24. The T shaped aperture A exposes the dielectric capping layer 22. A wider portion of the T shaped aperture A (i.e., having a linewidth T2 from about 30 nm to about 100 nm) defines a contact region portion of a gate electrode that is eventually formed self-aligned to the T shaped aperture A. A narrower portion of the T shaped aperture A (i.e., having a linewidth T1 from about 5 nm to about 50 nm) defines an active region portion of the gate electrode that is eventually formed self-aligned to the T shaped aperture A. The T shaped aperture A is formed by first applying the photoresist layer 24 to the dielectric capping layer 22 and then lithography is used to pattern the photoresist layer 24.

Figure 3:
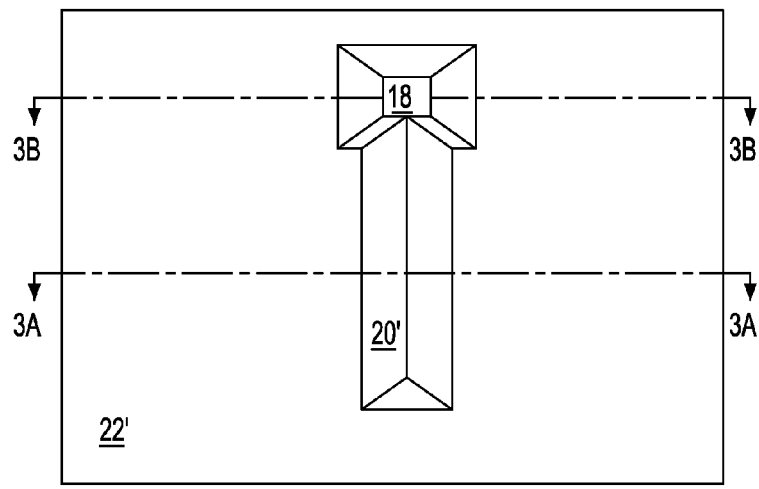
Figure 3A:
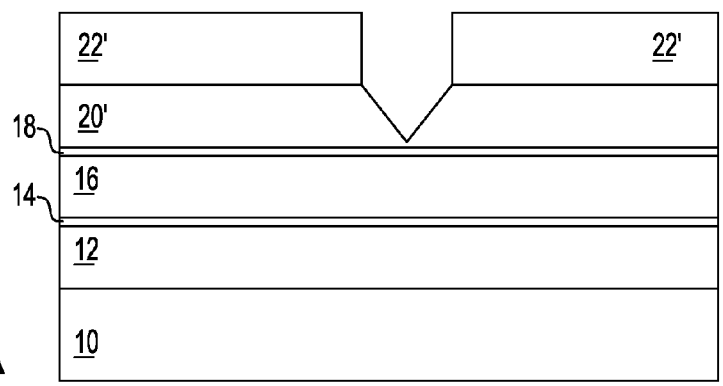
Figure 3B:
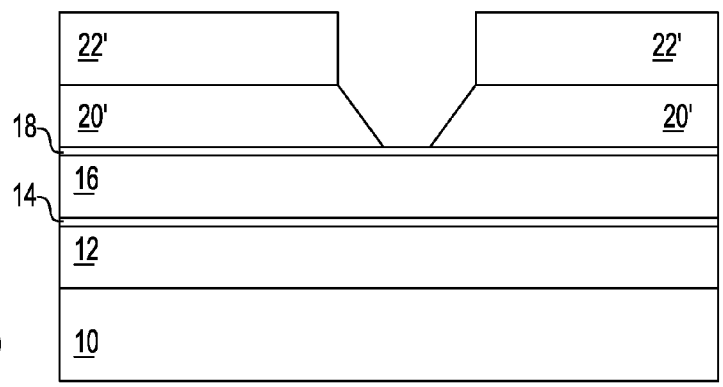

FIG. 3, FIG. 3A and FIG. 3B show a schematic plan-view and schematic cross-sectional diagrams illustrating the results of further processing of the semiconductor structure of FIG. 2, FIG. 2A and FIG. 2B.

FIG. 3, FIG. 3A and FIG. 3B first show the results of etching the dielectric capping layer 22 that is illustrated in FIG. 2, FIG. 2A and FIG. 2B to form the dielectric capping layer 22'. Although not specifically illustrated within the schematic cross-sectional diagrams of FIG. 3, FIG. 3A or FIG. 3B, the dielectric capping layer 22 is etched to form the dielectric capping layer 22' while using the photoresist layer 24 that is illustrated in FIG. 1 as an etch mask layer. The photoresist layer 24 is then removed to provide in part the semiconductor structure that is illustrated in FIG. 3, FIG. 3A and FIG. 3B.

The foregoing etching of the dielectric capping layer 22 to provide the dielectric capping layer 22' may be undertaken using methods that are conventional in the semiconductor fabrication art. The methods may include, but are not limited to, wet chemical etch methods and dry plasma etch methods. Dry plasma etch methods are often preferred for etching the dielectric capping layer 22 to form the dielectric capping layer 22' insofar as dry plasma etch methods generally provide straight sidewalls to the dielectric capping layer 22' that is formed incident to etching the dielectric capping layer 22.

Similarly, after having etched the dielectric capping layer 22 to form the dielectric capping layer 22', the photoresist layer 24 may be stripped using methods and materials that are conventional in the semiconductor fabrication art. Also included are wet chemical etch methods, dry plasma etch methods and aggregates of wet chemical etch methods and dry plasma etch methods.

FIG. 3, FIG. 3A and FIG. 3B also show the results of etching the surface semiconductor layer 20 to form a surface semiconductor layer 20'. As is illustrated within the schematic cross-sectional diagram of FIG. 3, FIG. 3A and FIG. 3B, etching of the surface semiconductor layer 20 to provide the surface semiconductor layer 20' is effected while using the dielectric capping layer 22' as an etch mask layer.

The foregoing etching is also intended to be a crystallographically specific etching that provides a V shaped aperture within the surface semiconductor layer 20'. The V shaped aperture results from a crystallographically specific etch character of the surface semiconductor layer 20 material to an etchant used for etching the surface semiconductor layer 20. Crystallographically specific etchants include ammonium hydroxide etchants and tetramethyl ammonium hydroxide etchants that are crystallographically specific for 111 crystallographic silicon surface orientations. Thus, within the schematic plan-view and cross-sectional diagrams of FIG. 3, FIG. 3A and FIG. 3B, the exposed surfaces of the surface semiconductor layer 20' with respect to the V shaped aperture will typically be 111 crystallographic surface orientations. The embodiment is not, however, limited to such a crystallographic orientation.

Figure 4A:
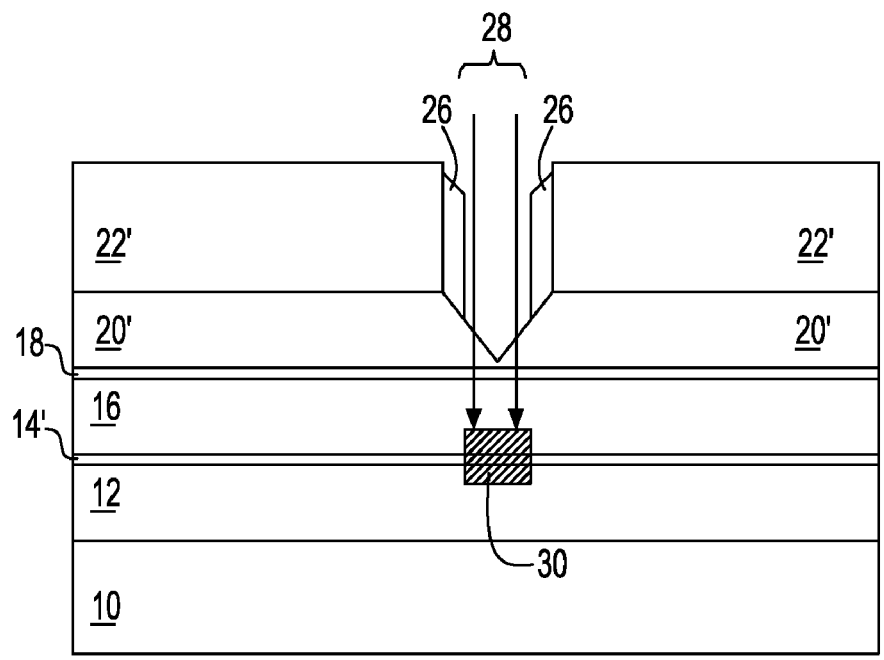
Figure 4B:
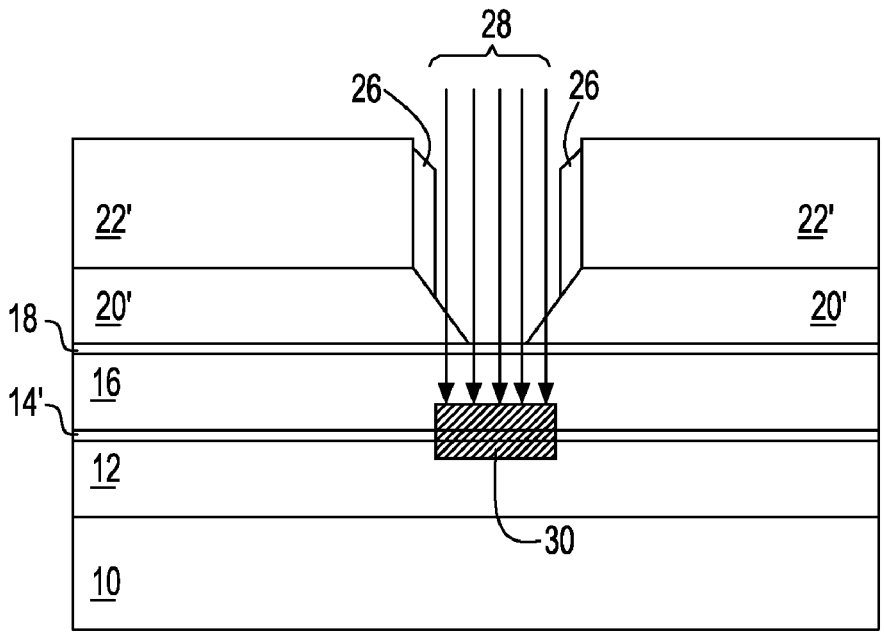

FIG. 4A and FIG. 4B show the results of further processing of the semiconductor structure that is illustrated in FIG. 3, FIG. 3A and FIG. 3B.

Specifically, FIG. 4A and FIG. 4B first show the results of forming spacer layers 26 adjoining the sidewalls of the dielectric capping layer 22', and generally above the V shaped aperture within the surface semiconductor layer 20'. The spacer layers 26 may be formed using an otherwise generally conventional blanket layer deposition and anisotropic etch-back method. Typically, the spacer layers 26 comprise a nitride material when the dielectric capping layer 22 comprises an oxide material. Such materials selections do not, however, limit the embodiment.

FIG. 4A and FIG. 4B also show a dose of implanting ions 28 that is implanted into the semiconductor structure of FIG. 3A or FIG. 3B after having formed the spacer layers 26 within the aperture defined in part by the dielectric capping layer 22'. When the etch stop layer 14 comprises a poly-Si material, the dose of implanting ions 28 may comprise germanium (i.e., Ge) implanting ions. In this case, the dose of implanting ions 28 is provided at a dose from about $3 \times 10^{14}$ to about $5 \times 10^{15}$ ions per square centimeter and an energy (e.g., for a thickness of the second buried dielectric layer 16 of about 50 nm) from about 80 to about 120 keV. The dose of implanting ions 28 is provided such as to effect an etch selectivity for an ion implanted region 30 of the etch stop layer 14 that thus forms in part an etch stop layer 14'. The ion implantation energy is selected so that the ion implantation range thereof peaks near the middle of the etch stop layer 14' at the location of the ion implanted region 30.

The embodiment contemplates that the implanting ions 28 may solubilize a specific ion implanted region 30 of the etch stop layer 14'. The mechanisms for such solubilization may include a chemical modification of the etch stop layer 14 when forming the ion implanted region 30 of the etch stop layer 14', as well as a physical modification of the etch stop layer 14 when forming the ion implanted region 30 of the etch stop layer 14'. The dose of implanting ions 28 may thus comprise any solubilizing ions that operate using a chemical mechanism (i.e., chemical modification), a physical mechanism (i.e., amorphization) or both a chemical mechanism and a physical mechanism.

Within the context of the instant embodiment, the implanting ions 28 typically comprise germanium implanting ions that provide both a chemical and a physical modification of the ion implanted region 30 of the etch stop layer 14'. The chemical modification and the physical modification allow the ion implanted region 30 of the etch stop layer 14' to be etched more rapidly in a particular etchant in comparison with other portions of the etch stop layer 14'. The instant embodiment is clearly not limited to implanting ions 28 that comprise only germanium implanting ions. Rather the embodiment also contemplates that other implanting ions 28 that provide chemical or physical modification of the ion implanted region 30 of the etch stop layer 14' may also be used within the embodiment. Examples of such implanting ions may include, but are not limited to: (1) boron implanting ions when the etch stop layer 14 comprises an oxide material; and (2) germanium implanting ions when the etch stop layer comprises a nitride material.

Figure 5A:
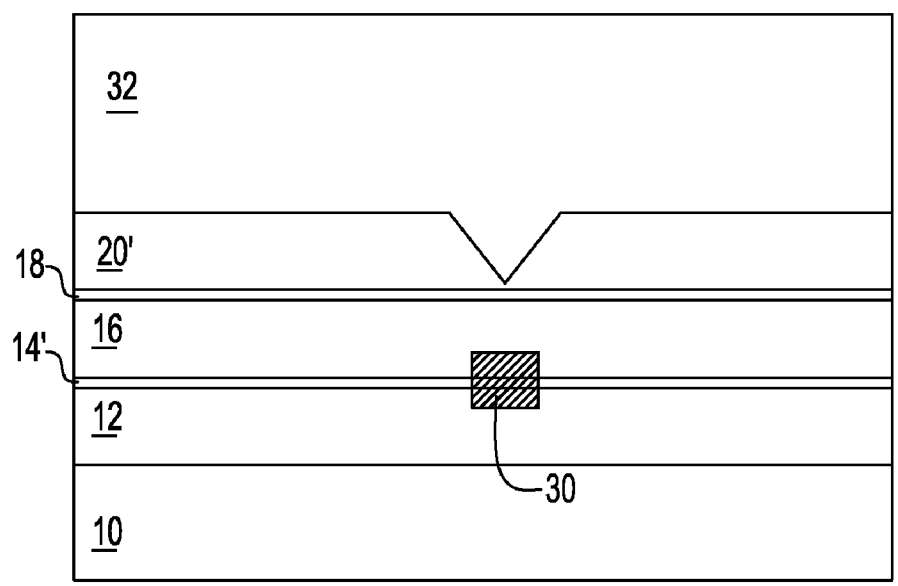
Figure 5B:
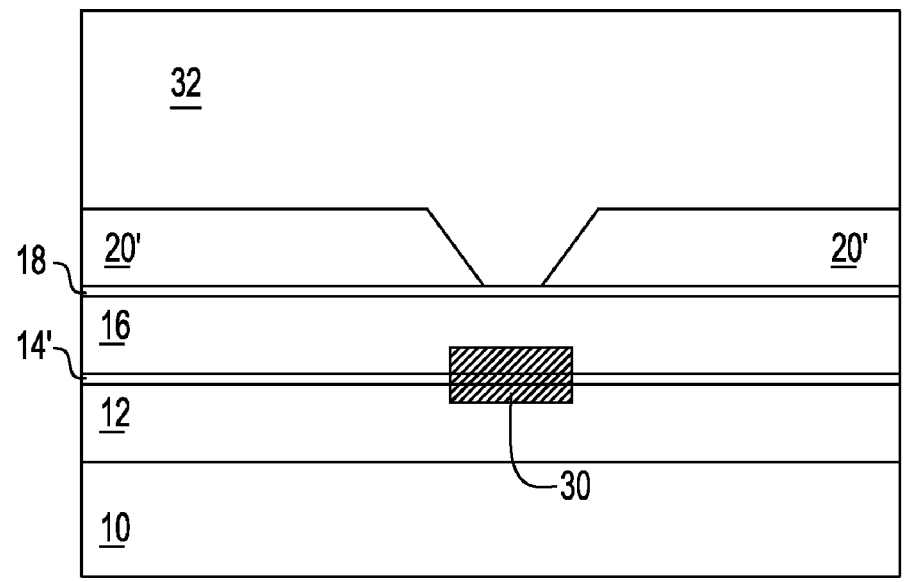

FIG. 5A and FIG. 5B first show the results of stripping the dielectric capping layer 22' from the semiconductor structure of FIG. 4A and FIG. 4B. The dielectric capping layer 22' may be stripped using methods and materials that are conventional in the semiconductor fabrication art, and appropriate to the materials of composition of the dielectric capping layer 22'. When the dielectric capping layer 22' comprises an oxide material, as is preferred within the instant embodiment, the dielectric capping layer 22' may be stripped using a wet chemical etch method that uses a hydrofluoric acid etchant. Alternatively, the dielectric capping layer 22' may be stripped using a plasma etch method that uses an appropriate etchant gas composition. Such an appropriate etchant gas composition will typically comprise a fluorine containing etchant gas.

FIG. 5A and FIG. 5B also show the results of forming a second dielectric capping layer 32 upon the semiconductor structure of FIG. 4A and FIG. 4B after having stripped the dielectric capping layer 22'. The second dielectric capping layer 32 may be formed using the same materials and the same methods that are used for forming the dielectric capping layer 22', but the second dielectric capping layer 32 comprises a blanket layer while the dielectric capping layer 22' comprises a patterned layer. Typically, the second dielectric capping layer 32 has a thickness from about 500 to about 2000 angstroms.

Figure 6:
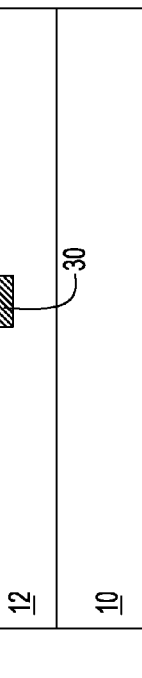
Figure 6A:
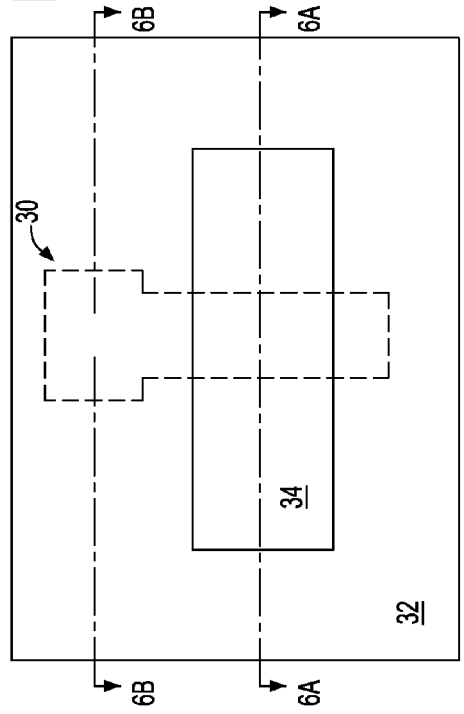
Figure 6B:
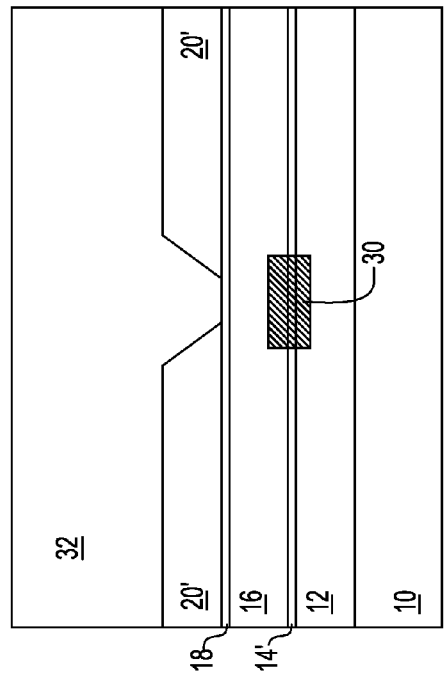

FIG. 6, FIG. 6A and FIG. 6B show a mask layer 34 located upon the semiconductor structure of FIG. 5A and FIG. 5B. The mask layer 34 may be formed from any of several mask materials utilizing processes well known in the semiconductor industry. Non-limiting examples include hard mask materials and photoresist mask materials, although photoresist mask materials are preferred. Typically, the mask layer 34 comprises a photoresist mask material that has a thickness from about 1000 to about 5000 angstroms. The mask layer 34 is located to span over a narrow portion of the ion implanted region 30.

Figure 7:
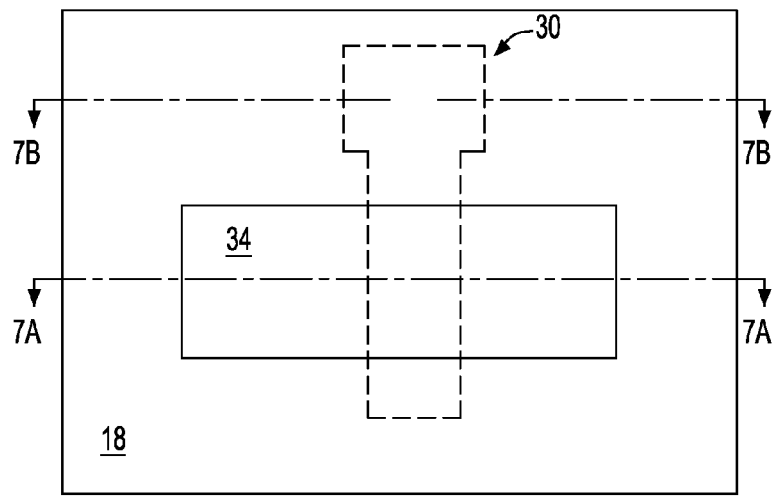
Figure 7A:
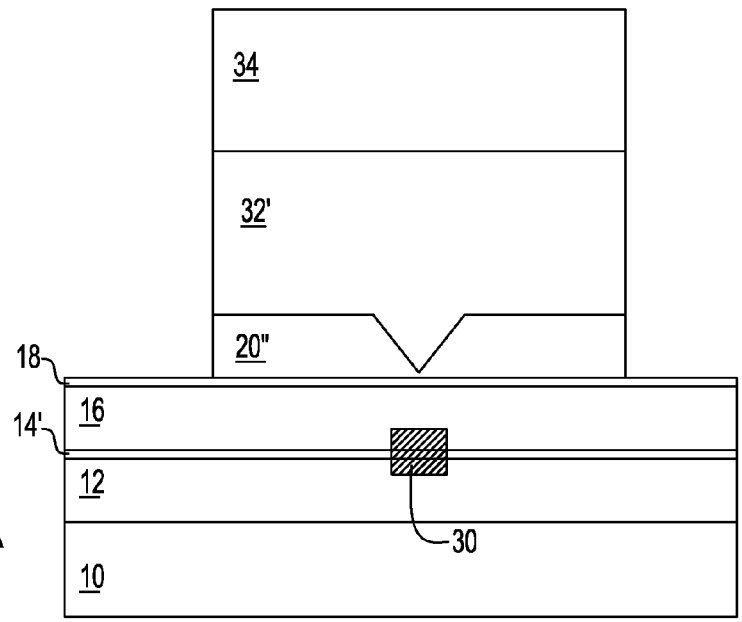
Figure 7B:
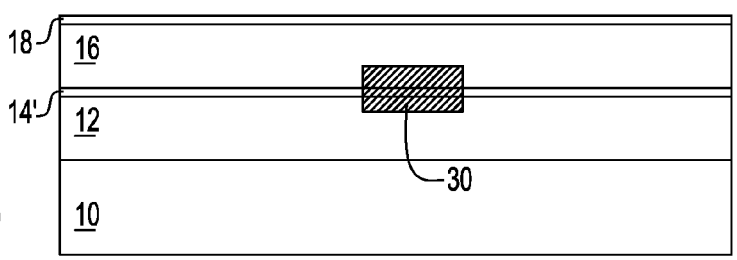

FIG. 7, FIG. 7A and FIG. 7B show the results of etching the second dielectric capping layer 32 and the surface semiconductor layer 20' to provide a surface semiconductor layer 20" and a second dielectric capping layer 32' located aligned thereupon. The etching is effected while using the mask layer 34 as an etch mask layer and the third buried dielectric layer 18 as an etch stop layer.

The etching is also typically effected while using a plasma etch method, in comparison with a wet chemical etch method, in order to provide substantially straight sidewalls to the second dielectric capping layer 32' and the surface semiconductor layer 20". The plasma etch method will typically use a fluorine containing etchant gas for etching the second dielectric capping layer 32' from the second dielectric capping layer 32. The plasma etch method will typically also use a chlorine containing etchant gas for etching the surface semiconductor layer 20" from the surface semiconductor layer 20'.

Figure 8A:
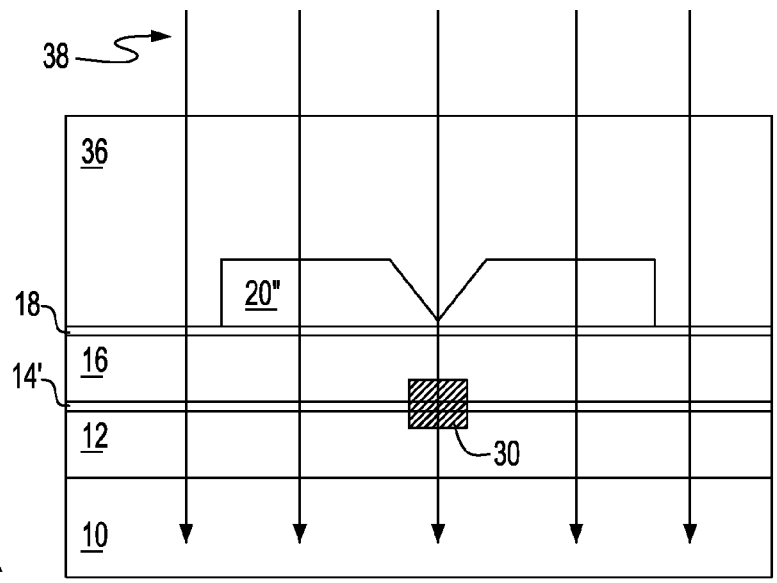

FIG. 8A first illustrates the results of stripping the mask layer 34 and the second dielectric capping layer 32' from the semiconductor structure of FIG. 7A. The mask layer 34 and the second dielectric capping layer 32' may be stripped using methods and materials that are appropriate to the materials of composition of the mask layer 34 and the second dielectric capping layer 32'.

FIG. 8A also shows the results of forming a third dielectric capping layer 36 located upon the semiconductor structure of FIG. 7A after having stripped therefrom the second dielectric capping layer 32' and the mask layer 34.

The third dielectric capping layer 36 may comprise materials, have dimensions and be formed using methods that are analogous to the materials, dimensions and methods that are used with respect to the second dielectric capping layer 32 that is illustrated in FIG. 5A and FIG. 5B.

FIG. 8A finally illustrates the results of ion implanting the semiconductor structure after having formed the third dielectric capping layer 36 thereupon. In particular, the ion implanting includes ion implanting the base semiconductor substrate 10 with a dose of hydrogen implanting ions 38 to a location such as to form a fracture plane within the base semiconductor substrate 10. The use of other implanting ions that may also provide a facture plane is not precluded.

Figure 8B:
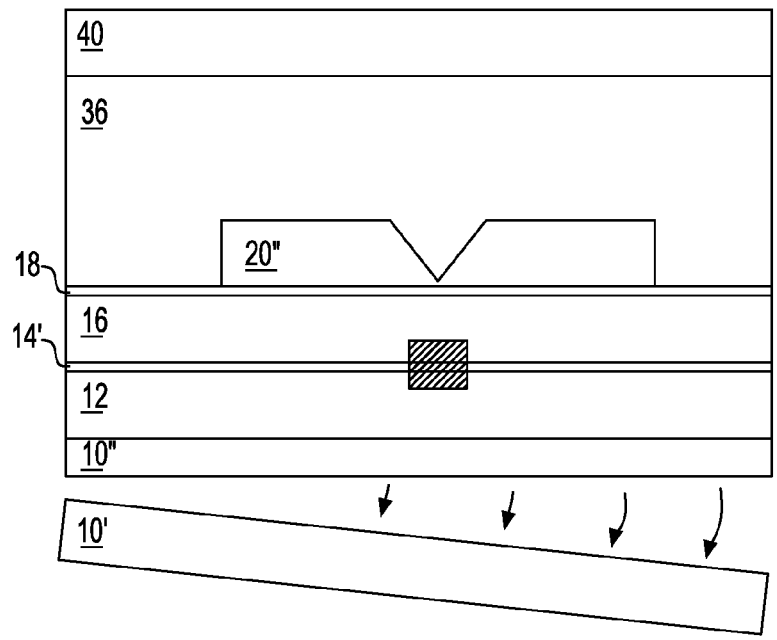

Correlating with FIG. 8A, FIG. 8B illustrates the results of fracturing the fracture plane within the base semiconductor substrate 10 to provide a discarded base semiconductor substrate 10' and a residual base semiconductor substrate 10'''. FIG. 8B also illustrates a handling substrate 40 laminated to the semiconductor structure prior to fracturing the base semiconductor substrate 10 when forming the discarded base semiconductor substrate 10' and the residual base semiconductor substrate 10'''. The handling substrate 40 is typically a semiconductor substrate. Alternative substrates are not excluded.

Within the instant embodiment, the dose of hydrogen implanting ions 38 employed is from about $1 \times 10^{16}$ to about $5 \times 10^{16}$ hydrogen ions per square centimeter and an ion implantation energy from about 10 to about 50 keV to provide the fracture plane that allows for forming the discarded base semiconductor substrate 10'' and the residual base semiconductor substrate 10'''.

Figure 9:
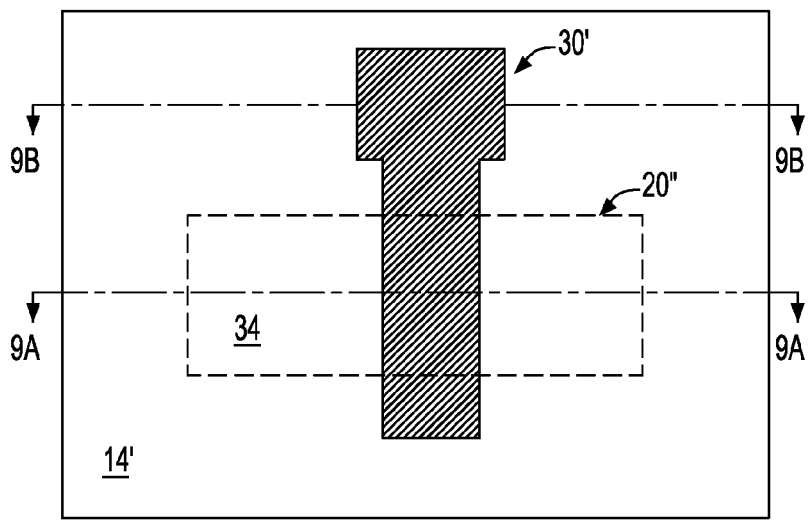
Figure 9A:
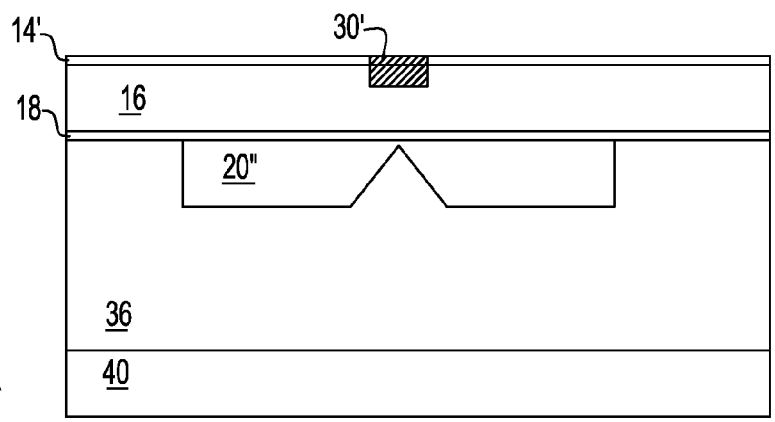
Figure 9B:
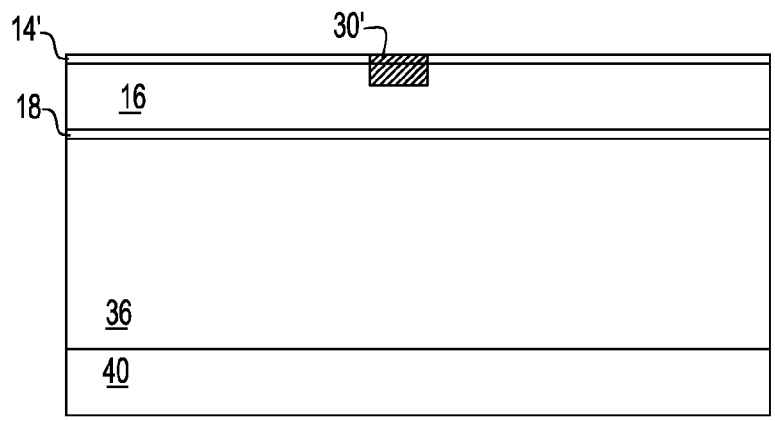

FIG. 9, FIG. 9A and FIG. 9B first show the results of inverting the semiconductor structure of FIG. 8, FIG. 8A and FIG. 8B. FIG. 9, FIG. 9A and FIG. 9B also show the results of: (1) etching the residual base semiconductor substrate 10' from the resulting semiconductor structure; and then (2) also etching the first buried dielectric layer 12 from the resulting semiconductor structure while using the etch stop layer 14' as an etch stop layer. As a result of the foregoing etching and resulting stripping, an ion implanted region 30' that encompasses the etch stop layer 14', is also exposed.

Each of the foregoing two etching steps, which are also stripping steps, may be undertaken using methods and materials that are conventional in the semiconductor fabrication art. Included are wet chemical etching methods and dry plasma etching methods. Dry plasma etching methods will typically use a chlorine containing etchant gas composition for etching a silicon containing semiconductor material and a fluorine containing etchant gas composition for etching a silicon containing dielectric material.

Figure 10:
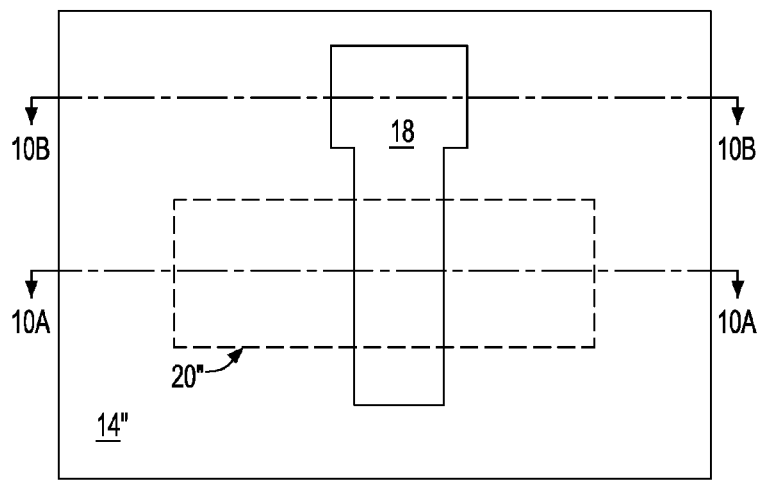
Figure 10A:
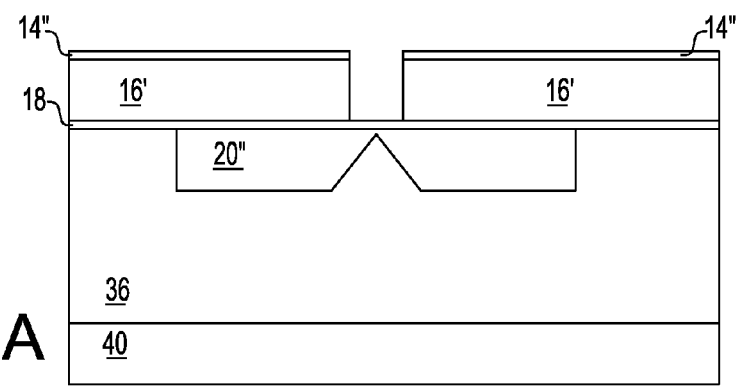
Figure 10B:
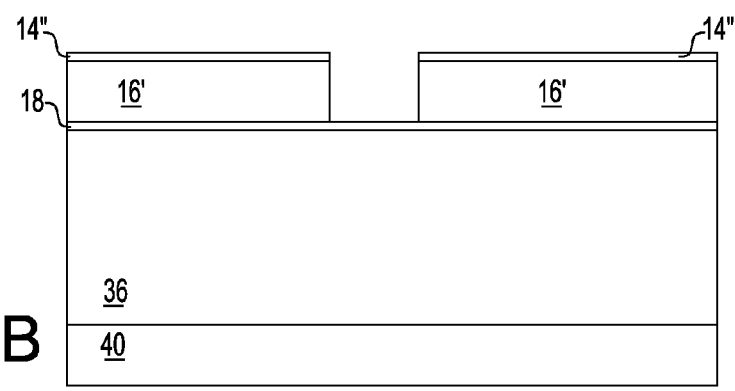

FIG. 10, FIG. 10A and FIG. 10B illustrate the results of further processing of the semiconductor structure that is illustrated in FIG. 9, FIG. 9A and FIG. 9B.

FIG. 10, FIG. 10A and FIG. 10B first show the results of etching the ion implanted region 30' portion of the etch stop layer 14' to form an etch stop layer 14''. The etch stop layer 14'' may then be used as a mask layer for etching the second buried dielectric layer 16 to form the second buried dielectric layer 16' and (optionally) subsequently also etching the third buried dielectric layer 18 to form a third buried dielectric layer that is not specifically shown. The foregoing etching may be effected using a plasma etch method that uses a fluorine containing etchant gas such as carbon tetrafluoride or trifluoromethane that etches a germanium doped polysilicon material (that preferably comprises the ion implanted region 30' of the etch stop layer 14') with specificity with respect to a base polysilicon material (that comprises a remainder portion of the etch stop layer 14'') absent germanium.

The second buried dielectric layer 16 and (optionally) the third buried dielectric layer 18 may be etched selectively using a plasma etch method. The plasma etch method typically uses a fluorine containing etchant gas composition for etching a silicon containing dielectric material.

As a result of the foregoing etching, an aperture within the second buried dielectric layer 16' is formed self aligned with an inverted V within the surface semiconductor layer 20''.

Figure 11:
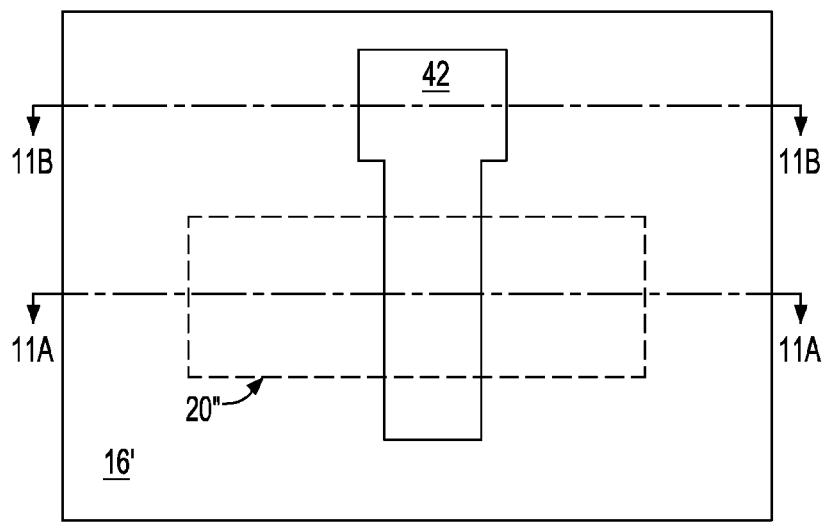
Figure 11A:
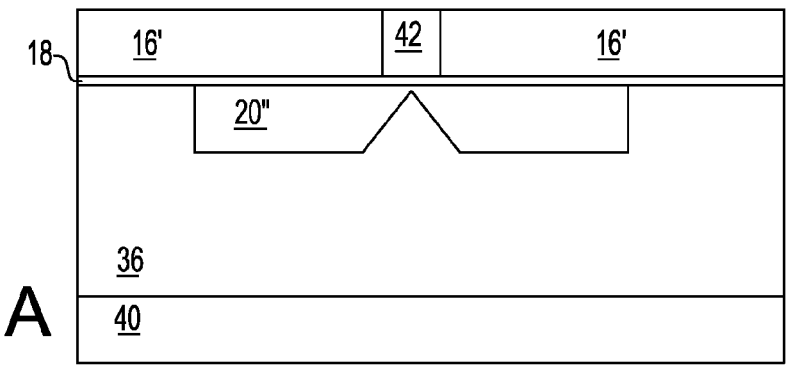
Figure 11B:
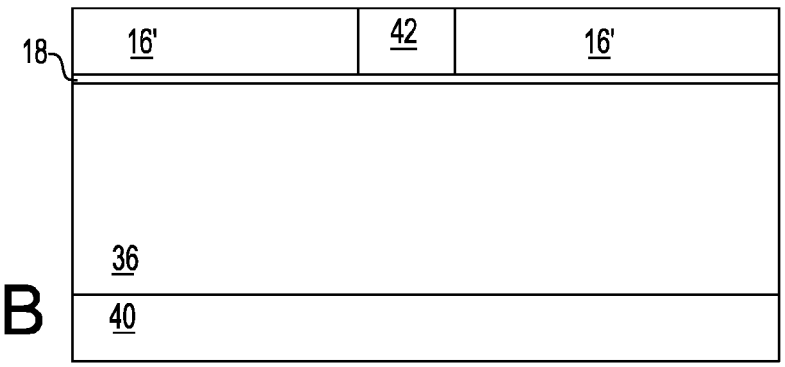

FIG. 11, FIG. 11A and FIG. 11B first show the optional results of thermally re-growing or physically depositing any portion of the third buried dielectric layer 18 that had previously been etched within the aperture defined by the second buried dielectric layer 16', to reform the third buried dielectric layer 18. Such thermal re-growth may be effected at a temperature from about 800° C. to about 1100° C. for a time period from about 1 second to about 5 minutes. Such thermal re-growth may yield a dielectric material selected from the group consisting of silicon oxide, silicon nitride and silicon oxynitride dielectric materials. This particular group of dielectric materials will generally have a dielectric constant from about 4 to about 20, measured in vacuum.

With respect to deposited dielectric materials that may backfill a portion of the third buried dielectric layer 18 that might intentionally or unintentionally have been etched, the embodiment also contemplates use of generally higher dielectric constant dielectric materials (i.e., having a dielectric constant from 20 to at least about 100, measured in vacuum). These generally higher dielectric constant dielectric materials may include, but are not limited to hafnium oxides, hafnium silicates, lanthanum oxides, titanium oxides, barium-strontium titantates (BSTs) and lead-zirconate titanates (PZTs). These generally higher dielectric constant dielectric materials may also be deposited using methods that are appropriate to their materials of composition. Non-limiting examples of methods include thermal or plasma oxidation or nitridation methods, chemical vapor deposition methods (including atomic layer chemical vapor deposition methods) and physical vapor deposition methods (including sputtering methods).

FIG. 11, FIG. 11A and FIG. 11B also show the results of forming a gate electrode 42 into the aperture defined by the third buried dielectric layer 16'.

The gate electrode 42 may comprise any of several gate electrode materials. Included are certain metals, metal alloys, metal silicides, doped polysilicon (i.e., having a dopant concentration from about 1e18 to about 1e22 dopant atoms per cubic centimeter) and polycide (doped polysilicon/metal silicide stack) gate electrode materials. The gate electrode materials may be deposited using any of several methods that are appropriate to a particular gate electrode material of composition. Included are chemical vapor deposition methods and physical vapor deposition methods. Typically, the gate electrode 42 comprises a material that has planarizing properties analogous to the planarizing properties of the etch stop material from which is comprised the etch stop layer 14". Thus, when the gate electrode 42 is formed using a blanket layer deposition and subsequent planarizing method, the etch stop layer 14" is also planarized while using the second buried dielectric layer 16' as an etch stop layer with respect to both the etch stop layer 14" and the gate electrode 42.

Figure 12:
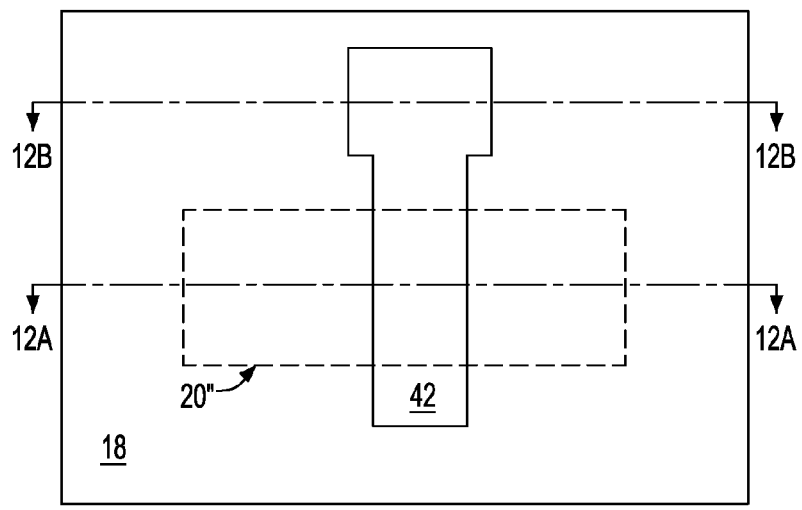
Figure 12A:
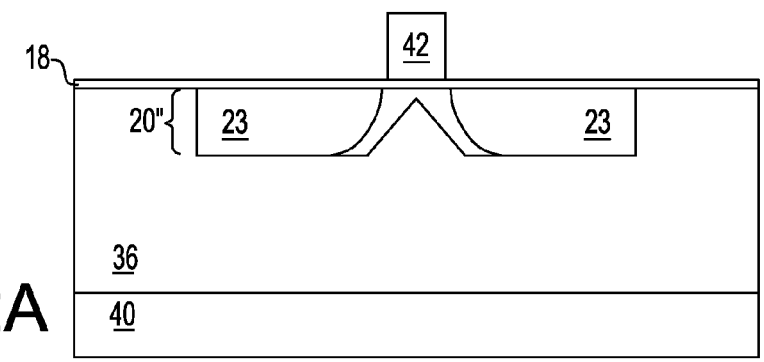
Figure 12B:
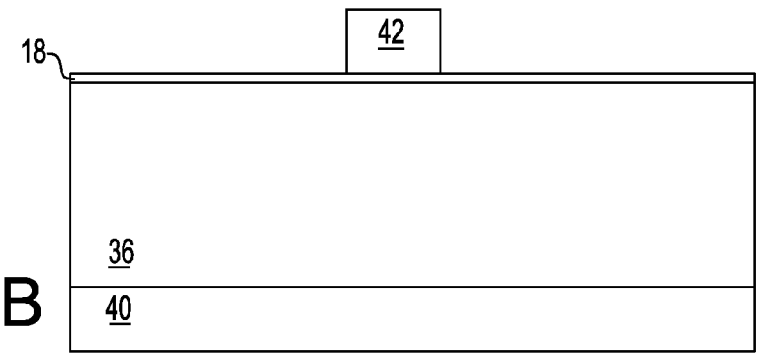

FIG. 12, FIG. 12A and FIG. 12B first show the results of stripping the second buried dielectric layer 16' from the semiconductor structure of FIG. 11, FIG. 11A and FIG. 11B. The second buried dielectric layer 16' may be stripped using methods and materials that are conventional in the semiconductor fabrication art. Such methods and materials include, but are not limited to wet chemical methods and materials and dry plasma methods and materials. When the second buried dielectric layer 16' comprises a nitride material, the second buried dielectric layer 16' may be stripped using an aqueous phosphoric acid etchant, or alternatively using a plasma etch method that uses a fluorine containing etchant gas.

FIG. 12A in particular also shows source/drain regions 23 that are located within the surface semiconductor layer 20''. The source/drain regions 23 are formed into the surface semiconductor layer 20'' while using the gate electrode 42 as a mask. Alternatively, the source/drain regions may be formed using a two step ion implantation method that uses the gate electrode 42, with and without a spacer layer that is not otherwise illustrated, as a mask.

FIG. 12, FIG. 12A and FIG. 12B show a series of schematic plan-view and cross-sectional diagrams of a semiconductor structure in accordance with a first embodiment of the invention. The first embodiment provides a semiconductor structure that comprises a field effect transistor. The field effect transistor comprises a gate electrode 42 located upon a third buried dielectric layer 18, a pertinent portion of which aligned beneath the gate electrode 42 comprises a gate dielectric. In turn, the gate electrode 42 is also separated by the gate dielectric from a surface semiconductor layer 20'', a portion of which aligned beneath the gate electrode 42 serves as a channel region within the field effect transistor. Within the semiconductor structure of FIG. 12, FIG. 12A and FIG. 12B, an inverted V shaped channel that separates a pair of source/drain regions 23 within the surface semiconductor layer 20'' is aligned beneath the gate electrode 42.

Within the instant embodiment, the channel region of the surface semiconductor layer 20'' comprises an inverted V aligned beneath the gate electrode 42. The inverted V shape of the surface semiconductor layer 20'' provides the benefit of an ultra-thin semiconductor-on-insulator structure without a series resistance compromise or a charge carrier mobility compromise of the channel region thereof. The semiconductor structure that is illustrated within the foregoing diagrams also realizes the foregoing objects absent use of a raised source/drain structure or recessed channel structure within a field effect transistor structure.

FIG. 13A to FIG. 16B show a series of schematic cross-sectional and plan-view diagrams illustrating the results of progressive stages in fabricating a semiconductor structure in accordance with another embodiment of the invention. This embodiment of the invention comprises a second embodiment of the invention.

Figure 13A:
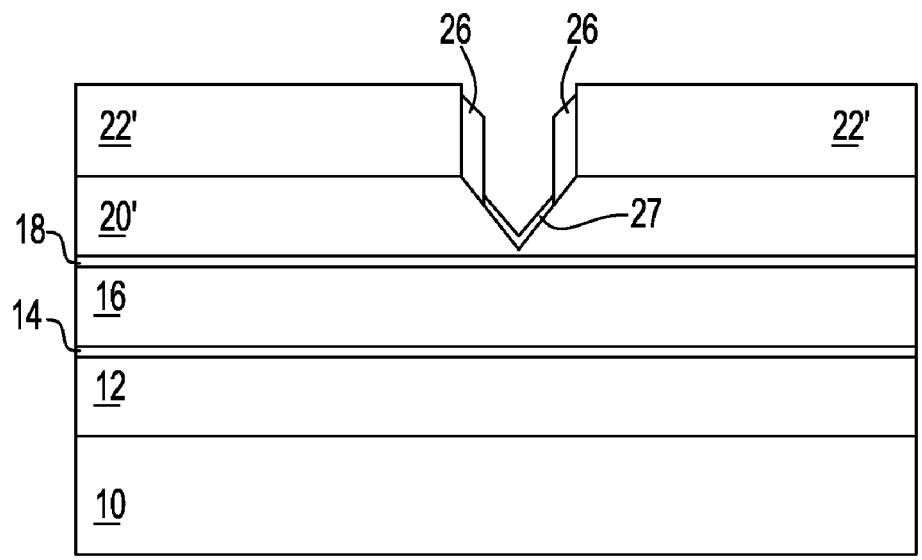
FIGS. 13A, 13B, 14A, 14B, 15, 15A, 15B, 16, 16A, and 16B show a series of schematic cross-sectional and plan-view diagrams illustrating the results of progressive stages in fabricating a semiconductor structure in accordance with another embodiment of the invention.
Figure 13B:
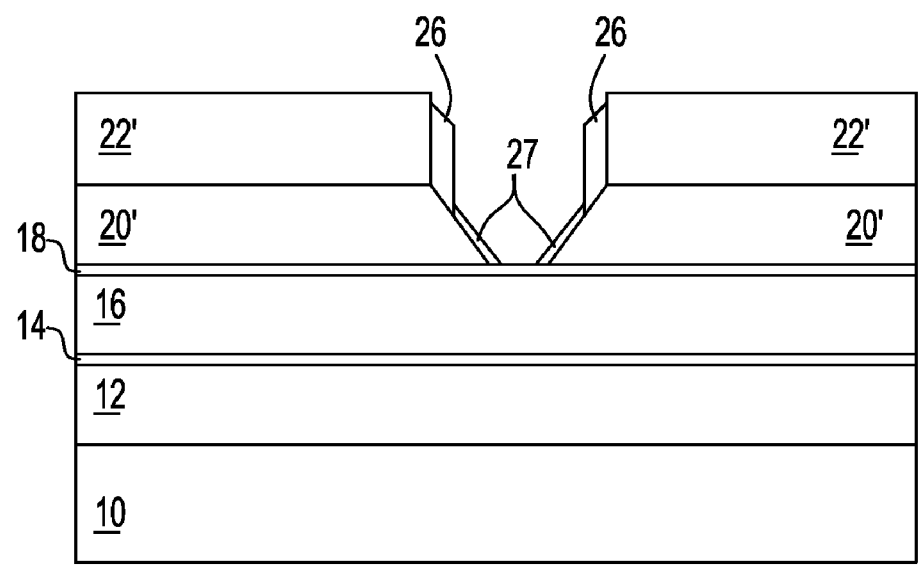

FIG. 13A and FIG. 13B show a pair of schematic cross-sectional diagrams of the semiconductor structure at an early stage in fabrication thereof in accordance with the second embodiment.

FIG. 13A and FIG. 13B correlate generally with FIG. 4A and FIG. 4B, but in a first instance absent the dose of implanting ions 28 that provide the ion implanted region 30.

FIG. 13A and FIG. 13B also in addition show a second gate dielectric 27 that is located within the V shaped channel within the surface semiconductor layer 20'. The second gate dielectric 27 may be either thermally grown or deposited. Preferably, the second gate dielectric 27 is thermally grown to provide the second gate dielectric 27 comprising an oxide of the material from which is comprised the surface semiconductor layer 20'. Typically, the second gate dielectric 27 comprises a thermal silicon oxide material that has a thickness from about 5 to about 50 angstroms.

Figure 14A:
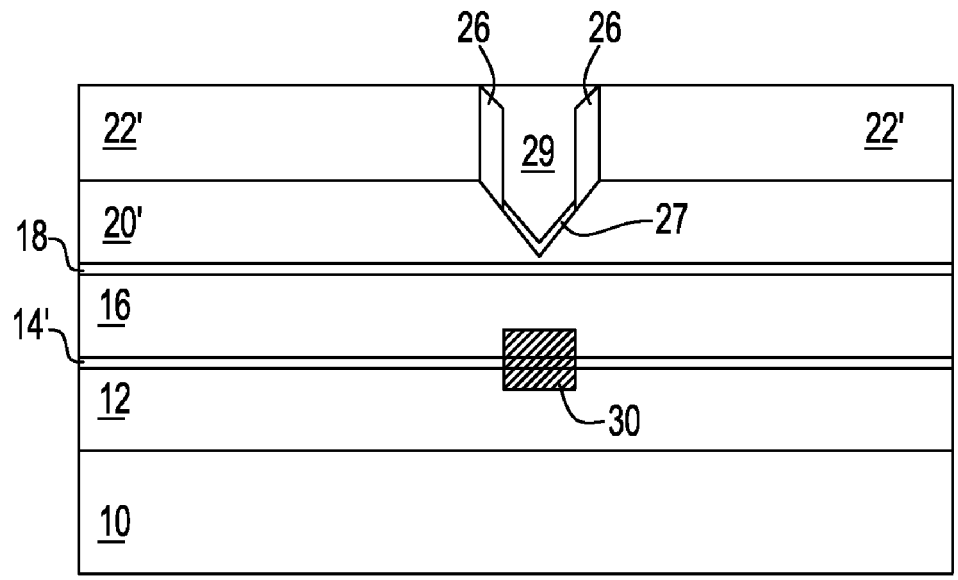
Figure 14B:
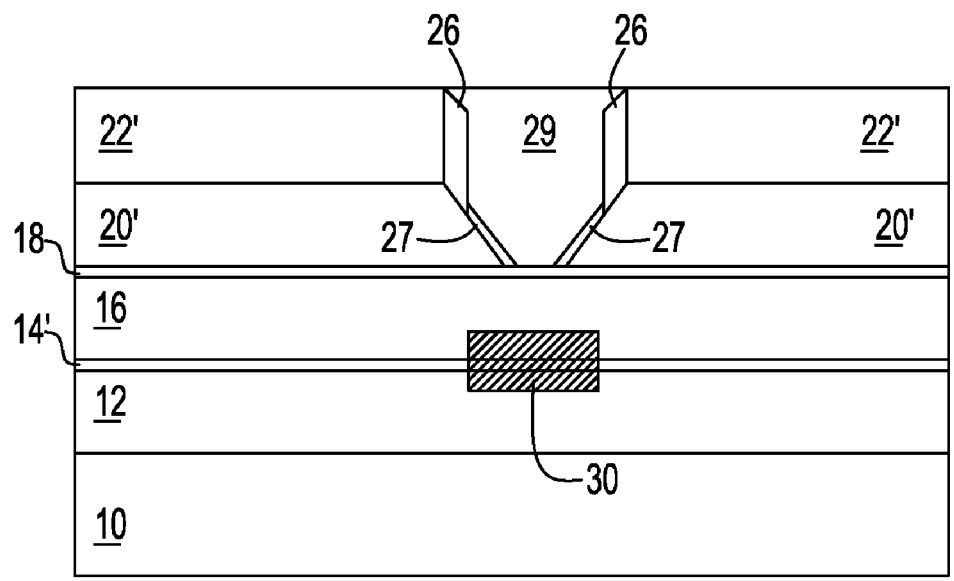

FIG. 14A and FIG. 14B first show the results of ion implanting the ion implanted region 30 that is illustrated in FIG. 4A and FIG. 4B. FIG. 14A and FIG. 14B also show the results of filling the aperture bounded by the spacers 26 and the second gate dielectric 27 and the third buried dielectric layer 18 with a second gate electrode 29. The second gate electrode 29 may comprise materials, have dimensions and be formed using methods that are analogous to the materials, dimensions and methods used in conjunction with the first gate electrode 42 that is illustrated in FIG. 11, FIG. 11A and FIG. 11B.

Thus, within the second embodiment, the V shaped groove within the surface semiconductor layer 20' is not backfilled with a dielectric material. Rather, the V shaped groove is first filled with a second dielectric layer 27, and also then with a second gate electrode 29.

Figure 15:
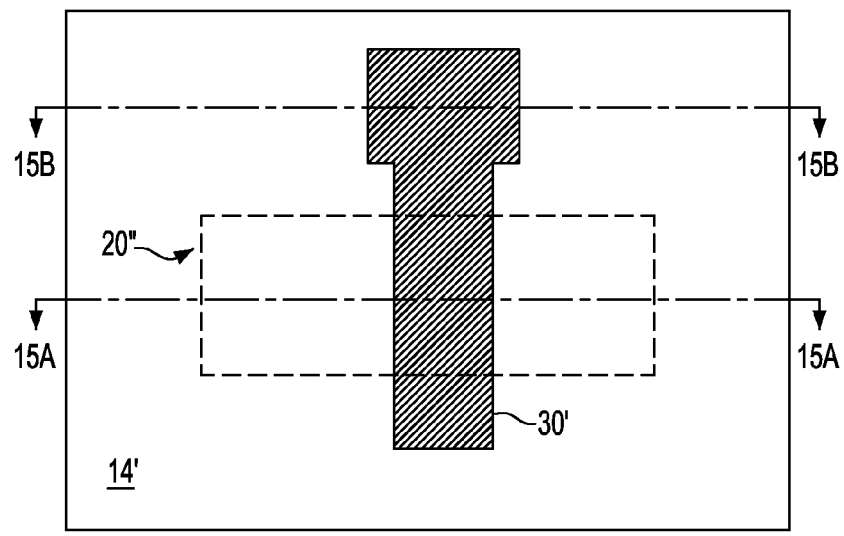
Figure 15A:
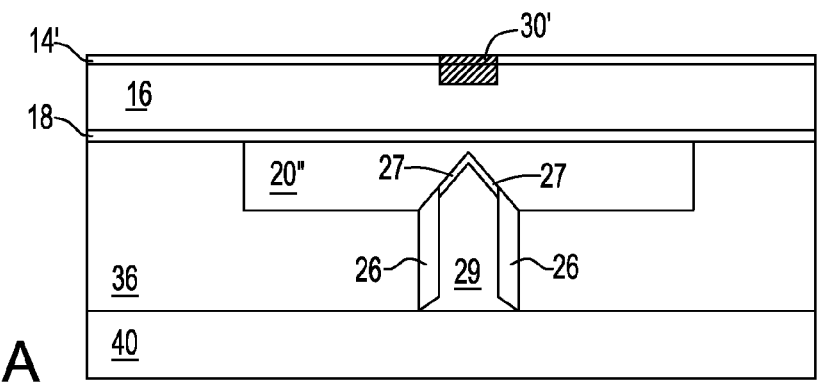
Figure 15B:
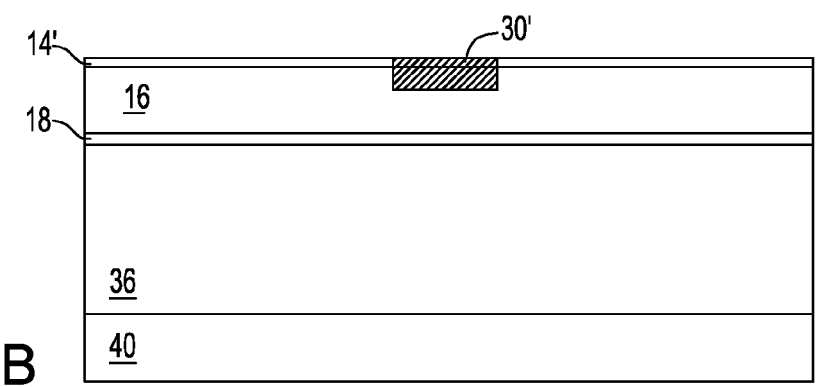

FIG. 15, FIG. 15A and FIG. 15B show the result of further processing of the semiconductor structure whose schematic cross-sectional diagram is illustrated in FIG. 14A and FIG. 14B.

FIG. 15, FIG. 15A and FIG. 15B show in general the result of a processing sequence that corresponds with FIG. 5A to FIG. 9B within the first embodiment.

FIG. 15, FIG. 15A and FIG. 15B first shows the result of patterning the surface semiconductor layer 20' to form the surface semiconductor layer 20". FIG. 15, FIG. 15A and FIG. 15B also show the results of laminating a handling substrate 40 to the resulting semiconductor structure and inverting the resulting semiconductor structure to form an inverted V shaped channel within the surface semiconductor layer 20".

FIG. 15, FIG. 15A and FIG. 15B also show the results of stripping layers from what is now the top surface of the semiconductor structure down to the level of the etch stop layer 14'.

Figure 16:
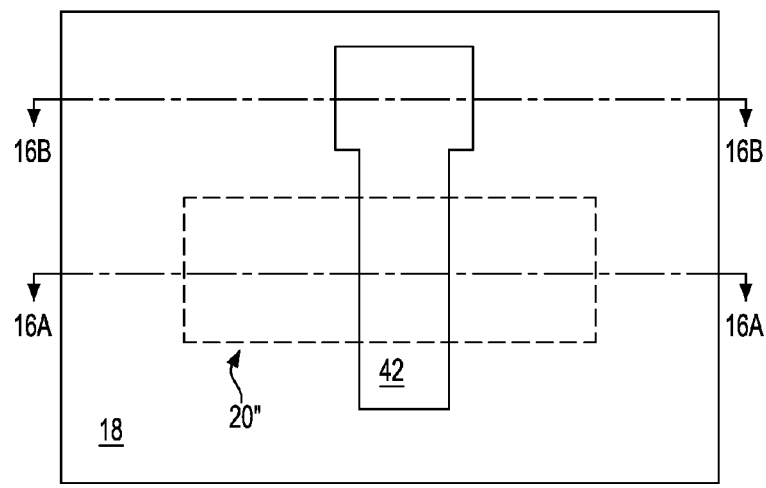
Figure 16A:
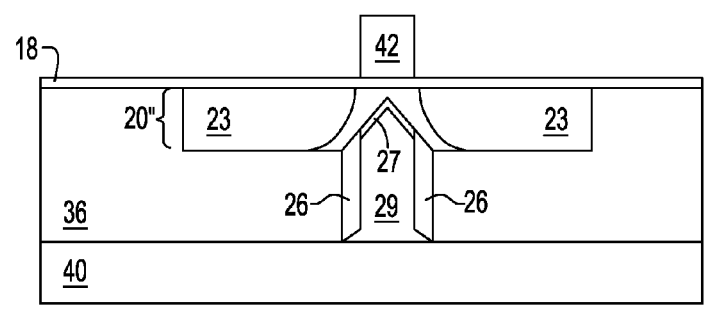
Figure 16B:
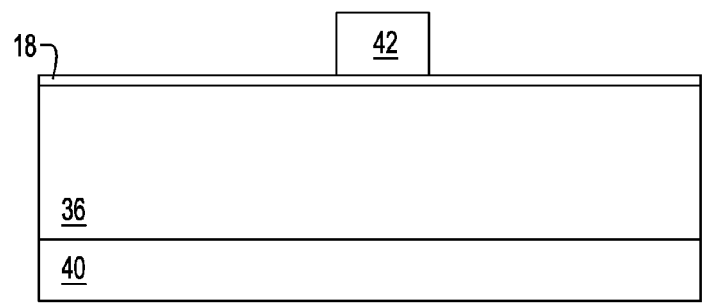

FIG. 16, FIG. 16A and FIG. 16B show the results of further processing of the semiconductor structure of FIG. 15, FIG. 15A and FIG. 15B that is otherwise illustrated within the context of the schematic cross-sectional diagrams of FIG. 10 to FIG. 12B within the first embodiment.

FIG. 16, FIG. 16A and FIG. 16B show a series of schematic plan-view and cross-sectional diagrams illustrating a semiconductor structure in accordance with a second embodiment of the invention.

This second embodiment also includes a surface semiconductor layer 20" that comprises an inverted V shaped channel. The surface semiconductor layer 20" comprises a planar surface having a third buried dielectric layer 18 that comprises a gate dielectric located thereupon. A gate electrode 42 is located over and aligned with the inverted V shaped channel. The semiconductor structure also comprises a second gate dielectric 27 located within the inverted V shape of the inverted V shaped channel region. A second inverted V shaped gate electrode 29 is located upon the second gate dielectric 27.

Thus, within the second embodiment, an inverted V shaped channel within a surface semiconductor layer 20" is controlled by an otherwise generally conventional gate electrode 42 and an inverted V shaped gate electrode 29. The source/drain regions 23 are not raised with respect to the gate electrode 42 (or a portion of the surface semiconductor layer 20" that comprises a channel with respect to the gate electrode 42). The source/drain regions 23 are raised with respect to the gate electrode 29 and the inverted V shaped channel within the surface semiconductor layer 20".

The semiconductor structure in accordance with the second embodiment otherwise exhibits similar channel series resistance and charge carrier mobility enhancements disclosed above for the semiconductor structure in accordance with the first embodiment.

The preferred embodiments of the invention are illustrative of the invention rather than limiting of the invention. Revisions and modifications may be made to methods, materials, structures and dimensions of a semiconductor structure in accordance with the preferred embodiments of the invention while still providing a semiconductor structure in accordance with the invention, further in accordance with the accompanying claims.

What is claimed is:

1. A method for fabricating a semiconductor structure comprising:
    forming within a semiconductor layer a V shaped notch, said forming comprises a crystallographically specific etchant;
    forming a first gate dielectric upon the V shaped notch and forming a first gate electrode upon the first gate dielectric;
    inverting the semiconductor layer to provide a first planar surface and a second interface opposite the first planar surface and including an inverted V shaped notch, said inverting including laminating a handling substrate over the interface including the V shaped notch;
    forming a second gate dielectric and a second gate electrode over the first planar surface and aligned with the inverted V shaped notch;
    forming a pair of source/drain regions within the semiconductor layer and separated by the inverted V shaped notch, wherein the pair of source/drain regions is raised with respect to the first gate electrode.

* * * * *